(12) United States Patent
Fan et al.

(10) Patent No.: US 11,874,990 B2
(45) Date of Patent: Jan. 16, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Fan, Beijing (CN); Yu Wang, Beijing (CN); Kemeng Tong, Beijing (CN); Fan He, Beijing (CN); Hongwei Ma, Beijing (CN); Xiangdan Dong, Beijing (CN); Qian Ma, Beijing (CN); Yuanqi Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/753,944

(22) PCT Filed: May 18, 2021

(86) PCT No.: PCT/CN2021/094371
§ 371 (c)(1),
(2) Date: Mar. 18, 2022

(87) PCT Pub. No.: WO2022/134435
PCT Pub. Date: Jun. 30, 2022

(65) Prior Publication Data
US 2023/0161427 A1    May 25, 2023

(30) Foreign Application Priority Data
Dec. 25, 2020 (CN) .......................... 202011558822.3

(51) Int. Cl.
*G06F 3/041* (2006.01)
*G06F 3/044* (2006.01)
*G09F 9/30* (2006.01)

(52) U.S. Cl.
CPC ........ *G06F 3/04164* (2019.05); *G06F 3/0412* (2013.01); *G06F 3/0443* (2019.05);
(Continued)

(58) Field of Classification Search
CPC .. G06F 3/0412; G06F 3/0446; G06F 3/04164; G06F 9/30; G09G 2300/0413
See application file for complete search history.

(56) References Cited

U.S. PATENT DOCUMENTS

| | | | |
|---|---|---|---|
| 2005/0099604 A1 | 5/2005 | Mizumaki et al. | |
| 2010/0176475 A1* | 7/2010 | Sano | H01L 27/1464 |
| | | | 257/E31.127 |

(Continued)

FOREIGN PATENT DOCUMENTS

| | | |
|---|---|---|
| CN | 107170774 A | 9/2017 |
| CN | 108681415 A | 10/2018 |

(Continued)

OTHER PUBLICATIONS

International Preliminary Report on Patentability received for PCT Patent Application No. PCT/CN2021/094371, dated Jul. 6, 2023, 9 pages (5 pages of English Translation and 4 pages of Original Document).

(Continued)

*Primary Examiner* — Peter D McLoone
(74) *Attorney, Agent, or Firm* — WOMBLE BOND DICKINSON (US) LLP

(57) ABSTRACT

A display panel and a display device including the same are provided. The display panel includes a base substrate, a touch electrode and a plurality of signal lines electrically (Continued)

connected with the touch electrode. The base substrate incudes a display region and a non-display region outside the display region, and the touch electrode is within the display region and the plurality of signal lines are within the non-display region. The non-display region includes a light reflective uneven region including a reflective material layer, which includes an uneven surface facing away from the base substrate. The display panel further includes a light reduction structure within the non-display region above the reflective material layer, which is at least configured to reduce light reflected from the uneven surface of the reflective material layer, and the light reduction structure is separated from the plurality of signal lines and the touch electrode.

20 Claims, 4 Drawing Sheets

(52) U.S. Cl.
CPC .............. *G06F 3/0446* (2019.05); *G09F 9/30* (2013.01); *G09G 2300/0413* (2013.01)

(56) References Cited

U.S. PATENT DOCUMENTS

| | | |
|---|---|---|
| 2010/0309160 A1 | 12/2010 | Lin |
| 2017/0257939 A1 | 9/2017 | Sano et al. |
| 2019/0131375 A1* | 5/2019 | Kim ................... H10K 59/124 |
| 2020/0117313 A1 | 4/2020 | Zhang et al. |
| 2021/0193754 A1 | 6/2021 | Han et al. |
| 2021/0364673 A1 | 11/2021 | Eguchi et al. |
| 2021/0397279 A1 | 12/2021 | Li et al. |
| 2022/0069053 A1* | 3/2022 | Choi ................... H10K 59/131 |

FOREIGN PATENT DOCUMENTS

| | | |
|---|---|---|
| CN | 110244873 A | 9/2019 |
| CN | 110489009 A | 11/2019 |
| CN | 111602075 A | 8/2020 |
| CN | 112612371 A | 4/2021 |
| CN | 214098387 U | 8/2021 |

OTHER PUBLICATIONS

International Preliminary Report on Patentability received for PCT Patent Application No. PCT/CN2021/125885, dated Jul. 6, 2023, 11 pages (5 pages of English Translation and 6 pages of Original Document).

International Search Report and Written Opinion received for PCT Patent Application No. PCT/CN2021/094371, dated Jul. 1, 2021, 11 pages (5 pages of English Translation and 6 pages of Original Document).

International Search Report and Written Opinion received for PCT Patent Application No. PCT/CN2021/125885, dated Dec. 23, 2021, 13 pages (6 pages of English Translation and 7 pages of Original Document).

Non-Final Office Action received for U.S. Appl. No. 17/904,968, dated Jun. 1, 2023, 11 pages.

Notice of Allowance received for U.S. Appl. No. 17/904,968, dated Aug. 18, 2023, 7 pages.

* cited by examiner

DISPLAY PANEL AND DISPLAY DEVICE

RELATED PATENT APPLICATION

The present patent application is a 35 U.S.C. 371 national stage application of a PCT International Application No. PCT/CN2021/094371, filed on May 18, 2021, which claims the priority benefits of patent application No. 202011558822.3 filed to the Patent Office of China on Dec. 25, 2020, the disclosure of which is incorporated herein by reference.

TECHNICAL FIELD

This disclosure relates to the field of display technologies, and in particular to a display panel and a display device comprising the same.

BACKGROUND

At present, touch technologies have been widely applied in various types of display devices, e.g., OLED touch display devices and LCD touch display devices, and have greatly improved the user's use experience of display devices. A display device involving touch technologies usually comprises a touch IC chip (also referred to as touch controller) for transmitting control signals to a touch electrode in the display device or receiving sensing signals from the touch electrode so as to determine a touch position of the user. However, for the existing touch display devices, the touch performance and the user experience still need to be improved.

SUMMARY

An embodiment of this disclosure provides a display panel, comprising: a base substrate, the base substrate comprising a display region and a non-display region outside the display region; a touch electrode on the base substrate, the touch electrode being located within the display region; and a plurality of signal lines electrically connected with the touch electrode, the plurality of signal lines being distributed within the non-display region. The non-display region comprises a light reflective uneven region, the light reflective uneven region comprises a reflective material layer on the base substrate, the reflective material layer comprises an uneven surface facing away from the base substrate, the display panel further comprises a light reduction structure within the non-display region, the light reduction structure is above the reflective material layer and at least configured to reduce light reflected from the uneven surface of the reflective material layer, and the light reduction structure is separated from the plurality of signal lines and the touch electrode.

According to some embodiments of the disclosure, an orthogonal projection of at least part of the light reduction structure on the base substrate at least partly overlaps an orthogonal projection of the reflective material layer on the base substrate.

According to some embodiments of the disclosure, the touch electrode comprises a plurality of first touch electrodes arranged in parallel and a plurality of second touch electrodes arranged in parallel, the plurality of first touch electrodes and the plurality of second touch electrodes intersect with each other, wherein the plurality of signal lines comprise a plurality of first signal lines connected with the plurality of first touch electrodes respectively and a plurality of second signal lines connected with the plurality of second touch electrodes respectively, and the light reduction structure comprises at least one first dummy line, the at least one first dummy line is located between the plurality of first signal lines and the plurality of second signal lines.

According to some embodiments of the disclosure, the light reduction structure comprises at least one second dummy line, the at least one second dummy line is located between the touch electrode and a signal line closest to the touch electrode among the plurality of signal lines.

According to some embodiments of the disclosure, the display panel further comprises a pixel circuit located within the display region, wherein the reflective material layer comprises a DC voltage bus, the DC voltage bus is configured to transmit a DC voltage for the pixel circuit.

According to some embodiments of the disclosure, the display panel further comprises a plurality of data signal lines configured to transmit data signals to the pixel circuit, the plurality of data signal lines extend to the non-display region and is located between the base substrate and the DC voltage bus, at least some data signal lines among the plurality of data signal lines are offset from each other in a direction parallel with a bottom surface of the base substrate such that the DC voltage bus comprises an uneven surface facing away from the base substrate.

According to some embodiments of the disclosure, an orthogonal projection of at least part of the plurality of second signal lines on the base substrate partly overlaps an orthogonal projection of the DC voltage bus on the base substrate.

According to some embodiments of the disclosure, a convex surface of the uneven surface of the DC voltage bus facing away from the base substrate forms a slope angle of 30~60 degrees with respect to the base substrate.

According to some embodiments of the disclosure, the display panel further comprises a touch controller, and each of the plurality of first signal lines comprises a first segment and a second segment, the first segment and the second segment are connected with a first terminal and a second terminal of a corresponding first touch electrode among the plurality of first touch electrodes respectively, the first terminal is further from the touch controller than the second terminal, and the first touch electrode is electrically connected to the touch controller via the first segment and the second segment, and each of the plurality of second touch electrodes is electrically connected to the touch controller via a corresponding second signal line among the plurality of second signal lines, at least some second signal lines among the plurality of second signal lines extend twistedly in the non-display region such that the second signal lines electrically connected to the touch controller have a same length, and the at least one dummy line is located between the second segment of the first signal line and the at least some second signal lines.

According to some embodiments of the disclosure, a plurality of the first dummy lines are separated from each other and evenly distributed between the first signal lines and the second signal lines, and wherein a ratio of a width of each first dummy line to a pitch between respective first dummy lines of the plurality of the first dummy lines is greater than or equal to 1.

According to some embodiments of the disclosure, the ratio of the width of each first dummy line to the pitch between respective first dummy lines of the plurality of the first dummy lines is greater than or equal to 2.

According to some embodiments of the disclosure, each of the plurality of the first dummy lines extends in parallel with an edge of the display region closest to the first signal lines and the second signal lines.

According to some embodiments of the disclosure, the plurality of first signal lines are separated from each other and evenly distributed in the non-display region, and the plurality of second signal lines are separated from each other and evenly distributed in the non-display region, a ratio of a width of each first signal line to a pitch between respective first signal lines of the plurality of first signal lines is greater than or equal to 1, and a ratio of a width of each second signal line to a pitch between respective second signal lines of the plurality of second signal lines is greater than or equal to 1.

According to some embodiments of the disclosure, a width of each first signal line, a width of each second signal line and a width of each first dummy line are 3~50 μm, a pitch between respective first signal lines of the plurality of first signal lines, a pitch between respective second signal lines of the plurality of second signal lines, and a pitch between respective first dummy lines of the plurality of first dummy lines are 4~30 μm.

According to some embodiments of the disclosure, at least one of each first dummy line of the plurality of first dummy lines, each first signal line of the plurality of first signal lines and each second signal line of the plurality of second signal lines comprises a first metal wire, a second metal wire and an insulating layer between the first metal wire and the second metal wire, and the insulating layer comprises a via hole, and the first metal wire is electrically connected to the second metal wire through the via hole in the insulating layer.

According to some embodiments of the disclosure, materials of the plurality of signal lines and the light reduction structure comprise at least one selected from a group consisting of molybdenum, aluminum, titanium, molybdenum alloy, aluminum alloy and titanium alloy.

According to some embodiments of the disclosure, the display panel comprises an encapsulation layer within the non-display region, the encapsulation layer is located between the DC voltage bus and the plurality of signal lines, the encapsulation layer at least comprises a first inorganic encapsulation material layer, a second inorganic encapsulation material layer and an organic material encapsulation layer between the first inorganic encapsulation material layer and the second inorganic encapsulation material layer.

According to some embodiments of the disclosure, the display panel further comprises an encapsulation dam on the base substrate, the encapsulation dam surrounds the display region and extends within the non-display region, and the light reduction structure is located between the encapsulation dam and the display region.

According to some embodiments of the disclosure, the display panel comprises a pixel structure layer within the display region, the pixel structure layer is located between the touch electrode and the base substrate, and comprises an anode, a cathode and an organic light emitting layer between the anode and the cathode.

Another embodiments of the disclosure provides a display device, comprising the display panel according to any of the foregoing embodiments.

By arranging the dummy lines according to the embodiments of this disclosure in the non-display region of the display panel, etching uniformity in the etching process for the metal film layers during the preparation of the display panel can be promoted, and thus the touch performance of the display panel or display device can be improved, and moreover, this helps to alleviate or prevent occurrence of the bright spots or bright lines in the non-display region.

DETAILED DESCRIPTION OF EMBODIMENTS

Figure 1:
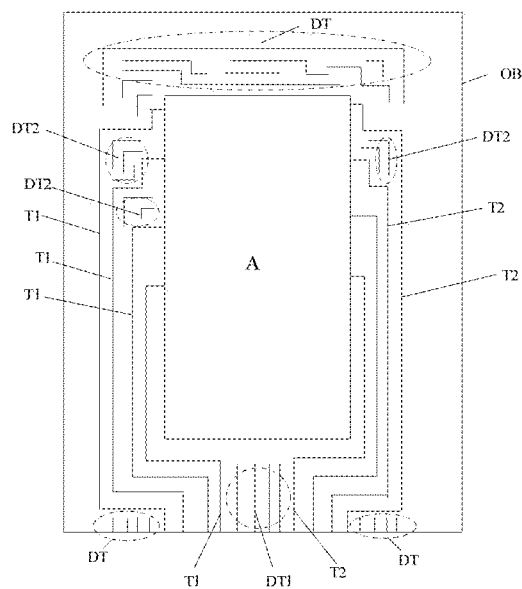
FIG. 1 schematically shows the distribution of the signal lines and the dummy lines in the display panel according to an embodiment of this disclosure.

Some embodiments of this disclosure will be explained below in detail by specific examples. It should be understood that the exemplary embodiments described below are only used to explain and clarify implementations of some embodiments of this disclosure rather than indicate the real structure of the display panel or display device. In particular, various wires shown in the drawings do not represent specific patterns of the wires in a real product, but only schematically show positions of the wires and relative position relationships with respect to other wires or regions of the display panel. Moreover, based on the embodiments described herein and the principle revealed by the embodiments, those skilled in the art may implement this disclosure otherwise, thereby obtaining further embodiments different from the embodiments described herein, and the further embodiments also fall within the scope of the present patent application. Therefore, the exemplary embodiments described herein do not limit the scope of the present patent application. In particular, words indicating position relationships of two items such as "above" and "below" mentioned herein should be understood based on examples in the drawings, and the meaning of "above" or "below" is not limited to "right above" or "right below", but instead, "above" or "below" is suitable for expressing spatial position relations between two items as long as there is a distance difference between the two items in a vertical direction perpendicular to a bottom surface of the base substrate.

In a non-display region of a touch display device, there are usually some metal wires which electrically connect a touch controller with a touch electrode in the display device. These metal wires are led out from terminals of the touch controller and extend to the touch electrode through the non-display region of the display device. It was found by the inventors of the present application that factors reducing the touch performance of the display device may be involved during the fabrication of the metal wires. Specifically, the metal wires in the periphery of the display region of the display device are not always evenly distributed within the non-display region. For example, for a display device having a rectangular display region, the metal wires may be distributed in the periphery of two or three of the four edges of the rectangular display region, with one edge of the display region having no metal wires in the periphery thereof, or some areas of the non-display region surrounding the rectangular display region are vacant areas having no metal wires. The inventors have realized that during the fabrication of the metal wires of the non-display region, etching uniformity of the metal film layers can hardly be ensured, and non-uniform etching of the metal film layers is one of the factors affecting the touch performance of the display device.

In light of the above technical awareness, an embodiment of this disclosure provides a display panel to improve the touch performance of the touch display device. The display panel according to the embodiment of this disclosure comprises a base substrate, a touch electrode, a plurality of signal lines and at least one dummy line. As shown in FIG. 1, the base substrate of the display panel comprises a display region A and a non-display region located outside the display region A, and the touch electrode is arranged on the base substrate and located within the display region A. The display panel further comprises a plurality of signal lines (e.g., first signal lines T1, second signal lines T2), and the signal lines T1 and T2 are electrically connected with the touch electrode so as to transmit touch signals to the touch electrode. The display panel further comprises at least one dummy line between at least some signal lines among the plurality of signal lines T1 and T2, the dummy line being separated from the plurality of signal lines. FIG. 1 illustrates a dummy line DT1 between the first signal lines T1 and the second signal lines T2, and a dummy line DT2 between the first signal lines T1 or between the second signal lines T2. OB in FIG. 1 indicates an outer boundary of the non-display region.

The "dummy lines" mentioned herein (including "first dummy line" and "second dummy line" that will be mentioned below in other embodiments) refer to lines that do not transmit signals during the operation of the display panel or display device, and the dummy lines are not connected with any other electrical components of the display panel or display device and do not receive any electric signals during the operation of the display device, or, some or all of the dummy lines are only electrically connected to a fixed potential (e.g., a ground potential). Besides, dummy lines independent of each other may present any kind of pattern, and the pattern of each of the dummy lines and the entire pattern of the dummy lines are not restricted in the embodiment of this disclosure.

For the display panel provided in the embodiment of this disclosure, a plurality of dummy lines may be fabricated at the same time when the signal lines of the non-display region are fabricated. The dummy lines and the signal lines together make the material of the metal wires distributed in the periphery of the display region more evenly, and correspondingly, during the fabrication of the signal lines and the dummy lines, the etching uniformity of the metal film layers can be promoted, which helps to improve the touch performance of the display panel or display device. In the example of FIG. 1, additional dummy lines DT are also shown, and the dummy lines DT are distributed between the outer boundary OB of the non-display region and a region where the plurality of signal lines are located. Likewise, the dummy lines DT can further improve the touch uniformity of the display panel or display device.

In practice, it was further found by the inventors of the present application that when the display panel is viewed from some angles, some areas of the non-display region may be perceived to appear brighter than other areas of the non-display region, thereby visually forming "bright lines" or "bright spots". Although the "bright lines" or "bright spots" have a small area, they affect the appearance of the display product to some extent, or even interfere with the user's viewing of the display picture and reduce the user's use experience of the display device.

Figure 2:
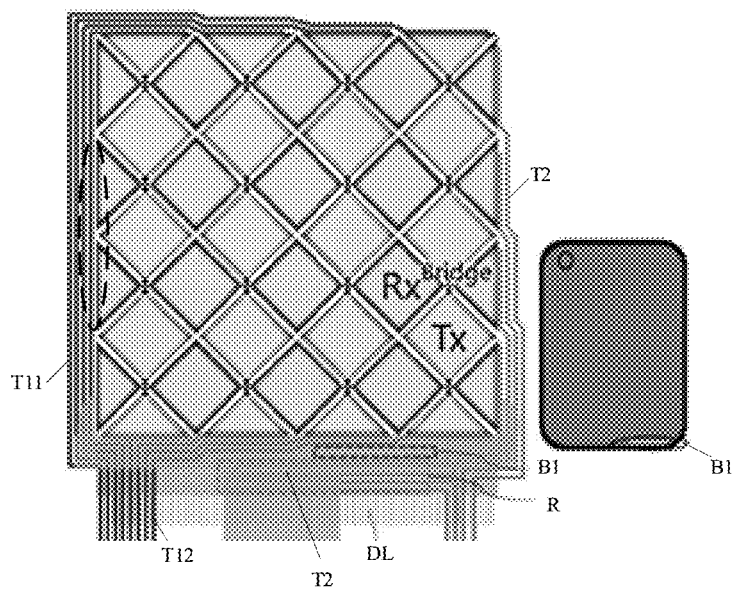
FIG. 2 shows a top view and a partial perspective view of the display panel according to another embodiment of this disclosure.

An example of the "bright lines" will be explained below by means of FIG. 2. In the display panel shown in FIG. 2, the "bright lines" are located in an area as indicated by B1 of FIG. 2 in the non-display region on the lower right of the display panel. After further study, it was found by the inventors of the application that the bright line area B1 substantially corresponds to a large area of the non-display region where no signal lines are provided (the area may be referred to as a vacant area herein). FIG. 2 also shows a partial perspective view of the display panel to schematically explain the touch electrode and the signal lines connected with the touch electrode. As shown in the left drawing of FIG. 2, the touch electrode comprises a plurality of first touch electrodes Rx arranged in parallel and a plurality of second touch electrodes Tx arranged in parallel, the plurality of first touch electrodes Rx and the plurality of second touch electrodes Tx intersecting with each other, and correspondingly, the plurality of signal lines comprise a plurality of first signal lines T11, T12 connected with the plurality of first touch electrodes Rx respectively and a plurality of second signal lines T2 connected with the plurality of second touch electrodes Tx respectively. The first touch electrode Rx and the second touch electrode Tx shown in FIG. 2 both comprise a rhombus touch electrode block, and a plurality of rhombus touch electrode blocks may be bridged via a connection line Bridge to form a first touch electrode or a second touch electrode. Obviously, the specific implementation of the touch electrode is not limited to the example of D2. For example, each first touch electrode Rx and each second touch electrode Tx may also be implemented to have a strip shape, and the specific form of the touch electrode is not limited at all herein. In the example of FIG. 2, the bright line area B1 is between the first signal lines T12 and the second signal lines T2, i.e., there is a large vacant area between the first signal lines T12 and the second signal lines T2. A display device usually comprises a reflective material that reflects light, and such a relatively large vacant area may allow a large amount of light reflected by the reflective material to be emitted out, so when viewing the display panel from some angles, human eyes may perceive the bright spots or bright lines.

The "first touch electrode" and the "second touch electrode" mentioned herein may refer to a reception electrode and a transmission electrode respectively, and the reception electrode and the transmission electrode are insulated from each other and can generate mutual capacitance, and during the operation of the display panel, the touch controller may transmit control signals to the transmission electrode and receive sensing signals from the reception electrode, and the touch position of the user can be determined based on changes of the mutual capacitance. Of course, the touch electrode may also have a structure based on the principle of self-capacitance sensing, but the specific arrangement and structure of the touch electrode are not key to the present invention, which will not be detailed herein.

Figure 3:
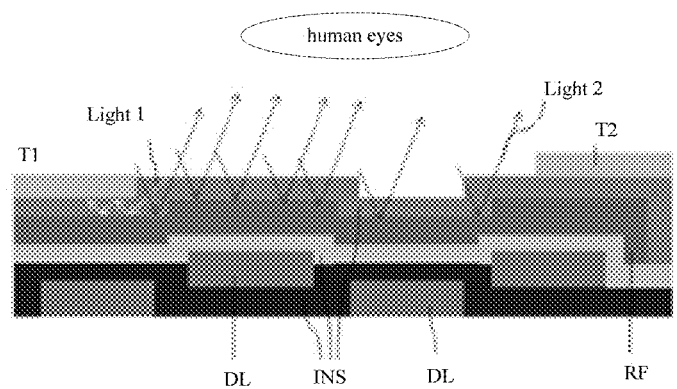
FIG. 3 shows a partial sectional view of the non-display region of the display panel according to another embodiment of this disclosure.

Further, it was found by the inventors of the present application that the severity of the "bright lines" or "bright spots" is not only caused by reflection of light, and more conspicuous "bright lines" or "bright spots" are also related to the internal structure of the display panel. FIG. 3 shows a partial sectional view of the non-display region of the display panel according to another embodiment of this disclosure. As shown in FIG. 3, the non-display region of the display panel comprises a light reflective uneven region, the light reflective uneven region comprising a reflective material layer RF located on the base substrate, the reflective material layer RF having an uneven surface facing away from the base substrate. FIG. 3 further shows first signal lines T1, second signal lines T2 and other signal lines (e.g., data signal lines DL). The base substrate is not shown in FIG. 3, and it is located below the data signal lines DL to support the structures of data signal lines DL, reflective material layer RF and so on. The data signal lines DL, the reflective material layer RF, the first signal lines T1 and the second signal lines T2 are insulated from each other by an insulating layer INS.

As shown in FIG. 3, due to factors such as manufacturing process, the signal lines (e.g., the data signal lines DL) on the base substrate cannot be flatly arranged on the base substrate, and different signal lines are offset from each other in a direction parallel with a bottom surface of the base substrate, in other words, there is a height difference between different signal lines in a vertical direction perpendicular to the bottom surface of the base substrate. Accordingly, other layers above the signal lines have to be implemented as having an uneven surface instead of having a flat surface. The inventors of the application have realized that the reflective material layer RF covering the data signal lines DL as shown in FIG. 3 has an uneven surface facing away from the base substrate, which further contributes to or exacerbates the occurrence of the bright lines or the bright spots. As shown in FIG. 3, the non-display region of the display panel comprises a vacant area between the first signal lines T1 and the second signal lines T2, and natural light incident onto the vacant area from different angles will have different effects on human eyes. For example, for natural light Light 1 as indicated by light arrows in FIG. 3, it is incident below the first signal lines T1 and reflected between the first signal lines T1 and the reflective material layer RF, and it will not or will hardly be perceived by the human eyes due to the presence of the first signal lines T1. For natural light Light 2 as indicated by dark arrows, it is incident onto the vacant area between the first signal lines T1 and the second signal lines T2, and it will be reflected out of the display panel from an uneven top surface of the reflective material layer RF and be perceived by the human eyes. Moreover, the uneven top surface of the reflective material layer RF may cause a significant light interference effect such that more conspicuous bright spots or bright lines will be perceived by the human eyes.

Therefore, the display panel provided by another embodiment of this disclosure comprises: a base substrate, the base substrate comprising a display region and a non-display region outside the display region; a touch electrode on the base substrate, the touch electrode being located within the display region; and a plurality of signal lines electrically connected with the touch electrode, the plurality of signal lines being distributed within the non-display region, the non-display region comprises a light reflective uneven region, the light reflective uneven region comprising a reflective material layer located on the base substrate, the reflective material layer having an uneven surface facing away from the base substrate, and the display panel further comprises a light reduction structure within the non-display region, the light reduction structure being located above the reflective material layer and at least configured to reduce light reflected from the uneven surface of the reflective material layer, the light reduction structure is separated from the plurality of signal lines and the touch electrode.

According to some embodiments of the disclosure, an orthogonal projection of at least part of the light reduction structure on the base substrate at least partly overlaps that of the reflective material layer on the base substrate. This can substantially alleviate or avoid the occurrence of "bright lines" or "bright spots", and bring the user a better human-machine interaction experience.

Figure 4:
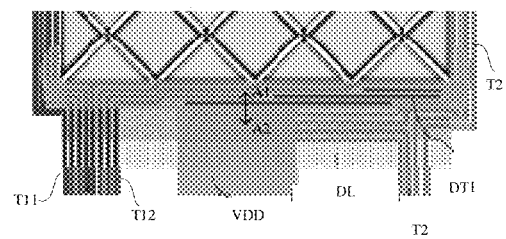
FIG. 4 shows a partial perspective view of the display panel according to another embodiment of this disclosure.
Figure 5:
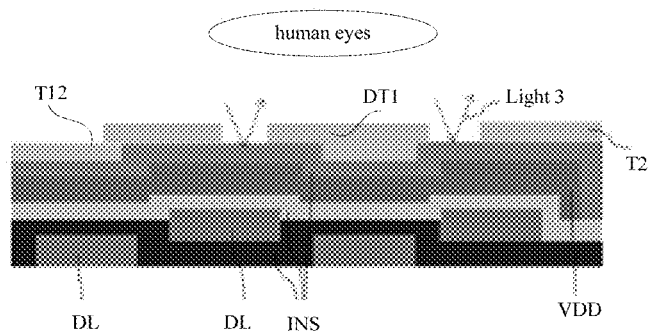
FIG. 5 shows a partial sectional view of the display panel of FIG. 4 taken along line A1-A2 of FIG. 4.

According to some embodiments of this disclosure, the touch electrode comprises a plurality of first touch electrodes arranged in parallel and a plurality of second touch electrodes arranged in parallel, the plurality of first touch electrodes and the plurality of second touch electrodes intersecting with each other, the plurality of signal lines comprise a plurality of first signal lines connected with the plurality of first touch electrodes respectively and a plurality of second signal lines connected with the plurality of second touch electrodes respectively, and the light reduction structure comprises at least one first dummy line, the first dummy line being located between the plurality of first signal lines and the plurality of second signal lines. The first dummy lines can at least block part of reflected light emitted out from the vacant area, thereby alleviating or avoiding the occurrence of "bright lines" or "bright spots", and improving the appearance of the display device and the user's use experience of the display device. In addition, as mentioned above, the first dummy lines can also promote the etching uniformity of the metal film layers during the fabrication of the signal lines, thereby improving the touch uniformity of the display device. Examples of the first dummy line will be further clearly explained with reference to FIG. 4 and FIG. 5. FIG. 4 shows a partial perspective view of the display panel according to another embodiment of this disclosure to schematically explain the signal lines and the first dummy lines in the periphery of the touch electrode. In order to facilitate comparison and understanding, the layout of the first signal lines and the second signal lines in FIG. 4 is similar to that in FIG. 2. As shown in FIG. 4, the first dummy lines DT1 (as indicated by dark line in FIG. 4) are arranged between the second signal lines T2 and the first signal lines T11, T12. The region where the first dummy lines DT1 are located may correspond to the area B1 in FIG. 2. FIG. 5 shows a partial sectional view of the region of the first dummy lines DT1 of FIG. 4 taken along line A1-A2. In the example of FIG. 4, the reflective material layer in the non-display region comprises a DC voltage bus VDD, the DC voltage bus VDD being configured to transmit a DC voltage for a pixel circuit in the display region of the display panel. The DC voltage bus VDD occupies a larger area than other signal lines, which is suitable for centrally providing a driving current to the pixel circuit in the display region and helps to avoid damage to the DC voltage bus caused by a large driving current. As can be seen from FIG. 4 and FIG. 5, the first dummy lines DT1 are arranged above the DC voltage bus VDD, and an orthogonal projection of at least part of the first dummy lines DT1 on the base substrate at least partly overlaps that of the DC voltage bus VDD on the base substrate. As shown in FIG. 5, due to the presence of the first dummy lines DT1, only a small part Light 3 of the natural light incident onto the non-display region is reflected out and no strong light interference effect as shown in FIG. 3 will be caused, so the amount of light reflected from the DC voltage bus VDD and perceived by the human eyes is greatly reduced, which can alleviate or even avoid the occurrence of bright lines or bright spots. It can be understood that the DC voltage bus VDD is only an example of the reflective material layer, and the reflective material layer may also be other layers having reflective characteristics. Besides, in the embodiment shown in FIG. 4, each first dummy line DT1 of the plurality of the first dummy lines DT1 extends in parallel with an edge of the display region closest to the first signal lines and the second signal lines.

As shown in FIG. 5, in some embodiments, the display panel comprises a plurality of data signal lines DL, the data signal lines DL being configured to transmit data signals to a pixel circuit in the display region, the data signal lines DL extending to the non-display region and being located between the base substrate and the DC voltage bus VDD, at least some data signal lines among the plurality of data signal lines are offset from each other in a direction parallel with a bottom surface of the base substrate such that the DC voltage bus VDD has an uneven surface facing away from the base substrate. Furthermore, an orthogonal projection of at least some of the second signal lines T2 on the base substrate partly overlaps that of the DC voltage bus VDD on the base substrate.

It should be understood that the sectional views of FIG. 5 and FIG. 3 are mainly intended for explaining structures such as the DC voltage bus VDD, the data signal lines DL, the first dummy lines DT1, the first signal lines and the second signal lines, with structures of the display panel not quite related to the problem to be solved herein being omitted, so FIG. 5 and FIG. 3 do not necessarily mean the whole structures of the display panel.

Figure 6:
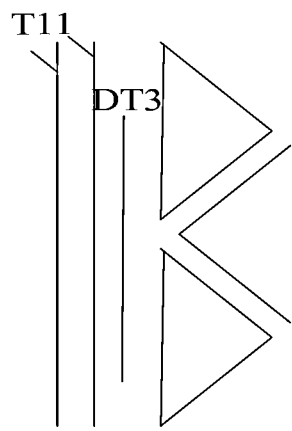
FIG. 6 shows an enlarged schematic view of a dash oval region in the display panel as shown in FIG. 2.

According to a further embodiment of this disclosure, the light reduction structure comprises at least one second dummy line, the second dummy line being located between the touch electrode and one of the plurality of signal lines closest to the touch electrode. In order to facilitate explanation of this embodiment, FIG. 6 schematically shows an enlarged view of the dash oval region as shown in FIG. 2. The light reduction structure comprises at least one second dummy line DT3, the second dummy line DT3 being located between the touch electrode and one of the plurality of signal lines closest to the touch electrode. The second dummy lines TD3 may at least achieve an effect similar to that of the first dummy lines DT1.

As mentioned above, the display panel comprises a touch controller, and the first touch electrodes and the second touch electrodes are connected to the touch controller via the first signal lines and the second signal lines respectively so as to achieve touch control of the display panel. Returning to FIG. 2, according to some embodiments of this disclosure, each of the first signal lines comprises a first segment T11 and a second segment T12, the first segment T11 and the second segment T12 being connected with a first terminal and a second terminal of a corresponding first touch electrode Rx of the plurality of first touch electrodes respectively, the first terminal being further away from the touch controller than the second terminal, the first touch electrode being electrically connected to the touch controller via the first segment T11 and the second segment T12, and each of the second touch electrodes Tx is electrically connected to the touch controller via a corresponding second signal line T2 of the plurality of second signal lines. In the example of FIG. 2, the first touch electrode and the second touch electrode both comprise a plurality of touch electrode blocks, and all of the touch electrode blocks may form an array of touch electrode blocks. The touch electrode blocks in each row of touch electrode blocks are sequentially connected to form a second touch electrode Tx, and the touch electrode blocks in each column of touch electrode blocks are sequentially connected to form a first touch electrode Rx. The touch controller is not shown in FIG. 2, and it may be arranged on the same side of the base substrate as the touch electrode, and located below the first signal lines and the second signal lines as shown in FIG. 2. Alternatively, the touch controller and the touch electrode may be arranged opposite each other, e.g., the base substrate may be a flexible base substrate, and the non-display region of the flexible base substrate is bendable to form a bent portion opposite the touch electrode. In this case, the touch controller may be arranged on the bent portion and thus opposite the touch electrode, i.e., the touch controller is concealed behind the display panel, which helps to narrow the bezel of the display device.

According to some embodiments of this disclosure, as shown in FIG. 2, at least some second signal lines T2 among the plurality of second signal lines extend twistedly in the non-display region such that the second signal lines T2 electrically connected to the touch controller have the same length, and the at least one dummy line is located between the second segment T12 of the first signal line and the at least some second signal lines T2. More specifically, as shown in FIG. 2, the second signal lines T2 connected with rows of second touch electrode blocks extend to the non-display region, some second signal lines T2 (which are also relatively closer to the touch controller) connected to the second touch electrodes Tx close to the non-display region are bent significantly, while some second signal lines T2 (which are also relatively further from the touch controller) connected to the second touch electrodes Tx relatively further from the non-display region are bent insignificantly or even not bent, and as a result, the second signal lines T2 electrically connected to the touch controller may have the same length, thereby avoiding a sharp difference between the resistance values of the second signal lines T2 and helping to improve the touch performance. It can be understood that the "same length" mentioned herein means that the length of the second signal lines are substantially the same, or the difference in the lengths of the second signal lines is controlled within a quite small range (e.g., the length difference does not exceed 10%). FIG. 2 schematically shows an area R where some second signal lines T2 extending twistedly to approach the second segments T12 of the first signal lines are located, and the area R may also be referred to as a resistance compensation area for the second signal lines. In order to avoid interference between the first signal lines and the second signal lines, a large vacant area is often formed between the first signal lines and the second signal lines, so according to some embodiments of this disclosure, as shown in FIG. 4, there is at least one first dummy line between the second segments of the first signal lines and the at least some second signal lines. It should be understood that the distribution pattern of the first signal lines and the second signal lines as shown in FIG. 2 does not limit the distribution of the first signal lines and the second signal lines in the display panel, but instead, the first signal lines and the second signal lines may be arranged in any other arrangement as determined by those skilled in the art as long as each touch electrode can be electrically connected with the touch controller.

Figure 7:
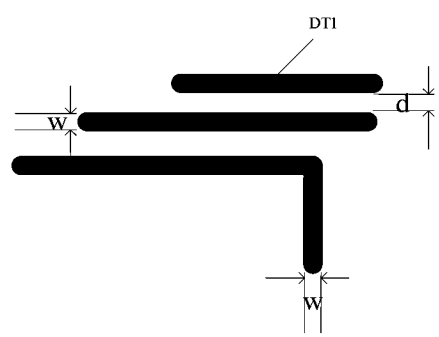
FIG. 7 shows the width of the first dummy line and the pitch between a plurality of first dummy lines.

Furthermore, it was found in practice by the inventors of the present application that for a plurality of dummy lines, different arrangements of the plurality of dummy lines have a certain influence on the improvement of the bright lines or bright spots. According to some embodiments of this disclosure, a plurality of first dummy lines are separated from each other and evenly distributed between the first signal lines and the second signal lines, and a ratio of a width of each first dummy line to a pitch between respective first dummy lines of the plurality of the first dummy lines is greater than or equal to 1. The width of the first dummy line mentioned herein refers to a dimension of the first dummy line in a direction perpendicular to the extending direction of the first dummy line in a plane parallel to the bottom surface of the base substrate. Moreover, if the first dummy line is bent in the plane parallel to the bottom surface of the base substrate, the orientation of the "width" will also vary with the bending. According to some embodiments of this disclosure, the width of the first dummy line is about 3~50 μm, and the pitch between respective first dummy lines is about 4~30 μm. FIG. 7 schematically shows several first dummy lines DT1, with the width of each first dummy line indicated as w and the pitch between the first dummy lines indicated as d. Through extensive experiments and study, it was found that when a ratio of the width w to the pitch d is greater than or equal to 1, the bright lines or bright spots perceived by human eyes are weaker than when the ratio of the width w to the pitch d is smaller than 1, and when the ratio of the width of the first dummy lines to the pitch between the first dummy lines is greater than or equal to 2, the bright lines or bright spots can be alleviated considerably or even eliminated.

According to some embodiments of this disclosure, the first signal lines, the second signal lines and the first dummy lines have substantially equal widths, e.g., each first signal line and each second signal line both have a width of 3~50 μm. Furthermore, the plurality of first signal lines are separated from each other and evenly distributed in the non-display region, and the plurality of second signal lines are separated from each other and evenly distributed in the non-display region, so as to facilitate the touch uniformity of the display panel. A ratio of a width of each first signal line to a pitch between respective first signal lines of the plurality of first signal lines is greater than or equal to 1, and a ratio of a width of each second signal line to a pitch between respective second signal lines of the plurality of second signal lines is greater than or equal to 1. In some further embodiments, a ratio of a width of each first signal line to a pitch between respective first signal lines of the plurality of first signal lines is greater than or equal to 2, and a ratio of a width of each second signal line to a pitch between respective second signal lines of the plurality of second signal lines is greater than or equal to 2. Such a design of the width of the first signal line and the second signal line and the pitch between the first signal lines and the pitch between the second signal lines can prevent or alleviate similar bright lines or bright spots that may occur in areas where the first signal lines and the second signal lines are located, thereby improving the user's use experience of the display device.

According to some embodiments of this disclosure, each of the first signal line, the second signal line and the dummy line (including the first dummy line) may comprise more than two metal wires, and the metal wires may be electrically connected with each other but distributed in different layers so as to help to reduce the whole resistance of the lines. In an example, at least one of the first dummy line, the first signal line and the second signal line comprises a first metal wire, a second metal wire and an insulating layer between the first metal wire and the second metal wire, and the insulating layer comprises a via hole, and the first metal wire is electrically connected to the second metal wire through the via hole in the insulating layer. In some embodiments, the material for making the first metal wire and the second metal wire comprises at least one of titanium (Ti), aluminum (Al), molybdenum (Mo), and alloy materials of the above metal elements. In an example, at least one of the first metal wire and the second metal wire comprises an aluminum layer and titanium layers on both sides of the aluminum layer. Therefore, the first metal wire may comprise a Ti/Al/Ti three-layer metal structure, and likewise, the second metal wire may also comprise a Ti/Al/Ti three-layer metal structure.

Figure 8:
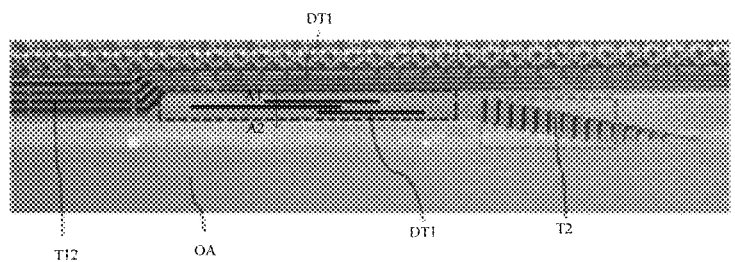
FIG. 8 shows an optical microscope view of a partial non-display region of the display panel according to another embodiment of this disclosure.

FIG. 8 shows an optical microscope view, i.e., a picture taken by an optical microscope, of a partial non-display region of the display panel according to some embodiments of this disclosure. The optical microscope view may generally correspond to the partial non-display region as shown in FIG. 4. FIG. 8 shows first dummy lines DT1, first signal lines T12, second signal lines T2 and an ink area OA, the ink area OA covering part of the signal lines.

Figure 9:
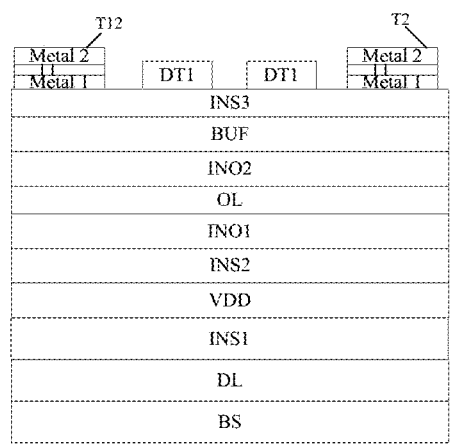
FIG. 9 shows a partial sectional view of the display panel of FIG. 8 taken along line A1-A2 of FIG. 8.

Next, major layer structures comprised in the non-display region of the display panel will be explained by means of FIG. 9, which shows a partial sectional view of the display panel taken along line A1-A2 of FIG. 8. As shown in FIG. 9, the display panel comprises a base substrate BS, data signal line DL, a first insulating layer INS1, a DC voltage bus VDD, a second insulating layer INS2, a first inorganic encapsulation material layer INO1, an organic encapsulation material layer OL, a second inorganic encapsulation material layer INO2, a buffer layer BUF, a third insulating layer INS3, a first dummy line DT1, a first signal line T12 and a second signal line T2. In some embodiments, the first signal line T12 and the second signal line T2 comprise a first metal wire, a second metal wire and an insulating layer between the first metal wire and the second metal wire, and the first metal wire is electrically connected to the second metal wire through a via hole in the insulating layer. The first dummy line DT1 is a single-layered metal wire. In the non-display region of the display panel, the display panel further comprises an encapsulation layer, the encapsulation layer being between the DC voltage bus VDD and the plurality of signal lines T2, T12, and the encapsulation layer at least comprises a first inorganic encapsulation material layer INO1, a second inorganic encapsulation material layer INO2 and an organic material encapsulation layer OL between the first inorganic encapsulation material layer INO1 and the second inorganic encapsulation material layer INO2. The encapsulation layer can provide encapsulation protection for each layer in the display region of the display panel, and in particular, the organic material encapsulation layer can have the function of releasing stress, and it may be completely covered by the first inorganic encapsulation material layer INO1 and the second inorganic encapsulation material layer INO2, thereby effectively preventing entrance of exterior vapor and oxygen into the interior of the display panel and effectively promoting the reliability and dependability of the display panel.

According to a further embodiment of the disclosure, the display panel further comprises an encapsulation dam on the base substrate, the encapsulation dam surrounding the display region and extending within the non-display region, and the light reduction structure is located between the encapsulation dam and the display region. For the embodiment shown in FIG. 8, the encapsulation dam may be located within the ink area OA and covered by an ink material, and there can be one or more encapsulation dams. Each encapsulation dam may have the same or different film layer structures. In an example, the encapsulation dam may comprise a protector and a barrier arranged sequentially in stack. In another example, the encapsulation dam may further comprise a support above the barrier. At least one of the protector, the barrier and the support may be in the same layer as a film layer in the display region of the display panel. For example, in an OLED display panel, the barrier of the encapsulation dam may be in the same layer as a pixel definition layer.

Figure 10:
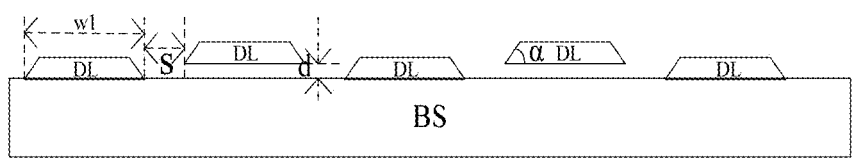
FIG. 10 shows a sectional view of the base substrate of the display panel and the data signal lines on the base substrate.

As mentioned above, in some embodiments, the signal lines (e.g., the data signal lines DL) on the base substrate may not be flatly arranged on the base substrate, and there is a height difference between different signal lines in a vertical direction perpendicular to the bottom surface of the base substrate. FIG. 10 schematically shows a plurality of data signal lines DL on the base substrate BS. The insulating layer between the data signal lines DL and other layers on the data signal lines DL are not shown for simplicity. According to some embodiments of this disclosure, the data signal lines DL are made of the same material as a gate of a thin film transistor of the display panel. The data signal line DL have approximately equal width w1, and pitch S between adjacent data signal lines DL is smaller than width w1 of a single data signal line DL, and a height different d between adjacent data signal lines DL is smaller than a pitch S between adjacent data signal lines DL, and the height difference herein refers to a difference between heights of the data signal lines in a vertical distance from the data signal lines to the top surface of the base substrate. In some embodiments, the height difference d is about 4000 Å, and the pitch S is smaller than 1 μm, e.g., 0.7 μm, and the width w1 is at least twice the pitch S, e.g., 2 μm. As shown in FIG. 10, the data signal lines DL have the same section. As shown in FIG. 10, a slope angle α of the data signal line DL is smaller than 60 degrees, e.g., 55 degrees.

In some embodiments, the DC voltage bus VDD may also have a slope angle in contrast to the case of FIG. 3. For example, a convex surface of the uneven surface of the DC voltage bus facing away from the base substrate may have a slope angle with respect to the base substrate, and the slope angle may be 30~60 degrees. The meaning of the slope angle between the base substrate and the convex surface of the uneven surface of the DC voltage bus facing away from the base substrate may also be understood with reference to the slope angle α in FIG. 10, which will not be expounded herein for simplicity.

The display panel mentioned in the above embodiments may be a display panel of various types, including but not limited to an organic light-emitting diode (OLED) display panel, a liquid crystal display (LCD) panel and so on. In the case of an OLED display panel, the touch electrode may be formed above the light-emitting layer. In other words, the display panel now further comprises a pixel structure layer between the touch electrode and the base substrate, and the pixel structure layer comprises an anode, a cathode and an organic light-emitting layer between the anode and the cathode.

Another embodiment of this disclosure provides a display device, the display device comprising the display panel according to any of the above embodiments. The type or usage of the display device is not limited at all herein, and the display device may be any electronic device or component having a display function, and examples of the display device include but are not limited to a mobile electronic device, a navigator, a watch, a printer, a computer, a PDA (Personal Digital Assistant), a TV and so on.

Some exemplary embodiments of this disclosure have been specifically described above, but those skilled in the art can understand and implement other variants of the disclosed embodiments by studying the drawings, the disclosure and the claims when implementing the technical solutions sought for protection. In the claims, the wording "comprise" or "comprising" does not exclude the presence of other elements. Although some features are stated in different dependent claims, the present application is also intended to cover embodiments combining these features.

The invention claimed is:

1. A display panel, comprising:
   a base substrate, the base substrate comprising a display region and a non-display region outside the display region;
   a touch electrode on the base substrate, the touch electrode being located within the display region; and
   a plurality of signal lines electrically connected with the touch electrode, the plurality of signal lines being distributed within the non-display region,
   wherein the non-display region comprises a light reflective uneven region, the light reflective uneven region comprises a reflective material layer on the base substrate, the reflective material layer comprises an uneven surface facing away from the base substrate,
   wherein the display panel further comprises a light reduction structure within the non-display region, the light reduction structure is above the reflective material layer and at least configured to reduce light reflected from the uneven surface of the reflective material layer, and
   wherein the light reduction structure is separated from the plurality of signal lines and the touch electrode.

2. The display panel according to claim 1, wherein an orthogonal projection of at least part of the light reduction structure on the base substrate at least partly overlaps an orthogonal projection of the reflective material layer on the base substrate.

3. The display panel according to claim 1, wherein the touch electrode comprises a plurality of first touch electrodes arranged in parallel and a plurality of second touch electrodes arranged in parallel, the plurality of first touch electrodes and the plurality of second touch electrodes intersect with each other, wherein the plurality of signal lines comprise a plurality of first signal lines connected with the plurality of first touch electrodes respectively and a plurality of second signal lines connected with the plurality of second touch electrodes respectively, and
   wherein the light reduction structure comprises at least one first dummy line, the at least one first dummy line is located between the plurality of first signal lines and the plurality of second signal lines.

4. The display panel according to claim 3, wherein the display panel further comprises a pixel circuit located within the display region, wherein the reflective material layer comprises a DC voltage bus, the DC voltage bus is configured to transmit a DC voltage for the pixel circuit.

5. The display panel according to claim 4, wherein the display panel further comprises a plurality of data signal lines configured to transmit data signals to the pixel circuit, the plurality of data signal lines extend to the non-display region and is located between the base substrate and the DC voltage bus, wherein at least some data signal lines among the plurality of data signal lines are offset from each other in a direction parallel with a bottom surface of the base substrate such that the DC voltage bus comprises an uneven surface facing away from the base substrate.

6. The display panel according to claim 5, wherein an orthogonal projection of at least part of the plurality of second signal lines on the base substrate partly overlaps an orthogonal projection of the DC voltage bus on the base substrate.

7. The display panel according to claim 5, wherein a convex surface of the uneven surface of the DC voltage bus facing away from the base substrate forms a slope angle of 30~60 degrees with respect to the base substrate.

8. The display panel according to claim 4, wherein the display panel comprises an encapsulation layer within the non-display region, the encapsulation layer is located between the DC voltage bus and the plurality of signal lines, wherein the encapsulation layer at least comprises a first inorganic encapsulation material layer, a second inorganic encapsulation material layer and an organic material encapsulation layer between the first inorganic encapsulation material layer and the second inorganic encapsulation material layer.

9. The display panel according to claim 3, wherein the display panel further comprises a touch controller, and each of the plurality of first signal lines comprises a first segment and a second segment, the first segment and the second segment are connected with a first terminal and a second terminal of a corresponding first touch electrode among the plurality of first touch electrodes respectively, the first terminal is further from the touch controller than the second terminal, and the first touch electrode is electrically connected to the touch controller via the first segment and the second segment, and each of the plurality of second touch electrodes is electrically connected to the touch controller via a corresponding second signal line among the plurality of second signal lines,
wherein at least some second signal lines among the plurality of second signal lines extend twistedly in the non-display region such that the second signal lines electrically connected to the touch controller have a same length, and
wherein the at least one dummy line is located between the second segment of the first signal line and the at least some second signal lines.

10. The display panel according to claim 3, wherein a plurality of the first dummy lines are separated from each other and evenly distributed between the first signal lines and the second signal lines, and wherein a ratio of a width of each first dummy line to a pitch between respective first dummy lines of the plurality of the first dummy lines is greater than or equal to 1.

11. The display panel according to claim 10, wherein the ratio of the width of each first dummy line to the pitch between respective first dummy lines of the plurality of the first dummy lines is greater than or equal to 2.

12. The display panel according to claim 10, wherein each of the plurality of the first dummy lines extends in parallel with an edge of the display region closest to the first signal lines and the second signal lines.

13. The display panel according to claim 10, wherein a width of each first signal line, a width of each second signal line and a width of each first dummy line are 3~50 µm, wherein a pitch between respective first signal lines of the plurality of first signal lines, a pitch between respective second signal lines of the plurality of second signal lines, and a pitch between respective first dummy lines of the plurality of first dummy lines are 4~30 µm.

14. The display panel according to claim 3, wherein the plurality of first signal lines are separated from each other and evenly distributed in the non-display region, and the plurality of second signal lines are separated from each other and evenly distributed in the non-display region,
wherein a ratio of a width of each first signal line to a pitch between respective first signal lines of the plurality of first signal lines is greater than or equal to 1, and a ratio of a width of each second signal line to a pitch between respective second signal lines of the plurality of second signal lines is greater than or equal to 1.

15. The display panel according to claim 3, wherein at least one of each first dummy line of the plurality of first dummy lines, each first signal line of the plurality of first signal lines and each second signal line of the plurality of second signal lines comprises a first metal wire, a second metal wire and an insulating layer between the first metal wire and the second metal wire, and the insulating layer comprises a via hole, and the first metal wire is electrically connected to the second metal wire through the via hole in the insulating layer.

16. The display panel according to claim 1, wherein the light reduction structure comprises at least one second dummy line, the at least one second dummy line is located between the touch electrode and a signal line closest to the touch electrode among the plurality of signal lines.

17. The display panel according to claim 1, wherein materials of the plurality of signal lines and the light reduction structure comprise at least one selected from a group consisting of molybdenum, aluminum, titanium, molybdenum alloy, aluminum alloy and titanium alloy.

18. The display panel according to claim 1, wherein the display panel further comprises an encapsulation dam on the base substrate, the encapsulation dam surrounds the display region and extends within the non-display region, and wherein the light reduction structure is located between the encapsulation dam and the display region.

19. The display panel according to claim 1, wherein the display panel comprises a pixel structure layer within the display region, the pixel structure layer is located between the touch electrode and the base substrate, and comprises an anode, a cathode and an organic light emitting layer between the anode and the cathode.

20. A display device, comprising the display panel according to claim 1.

* * * * *